United States Patent [19]
Gal

[11] Patent Number: 4,682,058
[45] Date of Patent: Jul. 21, 1987

[54] THREE-STATE LOGIC CIRCUIT FOR WIRE-ORING TO A DATA BUS

[75] Inventor: Laszlo V. Gal, Poway, Calif.

[73] Assignee: Unisys Corporation, Detroit, Mich.

[21] Appl. No.: 881,735

[22] Filed: Jul. 3, 1986

[51] Int. Cl.$^4$ ............................................. H03K 17/16
[52] U.S. Cl. .................................. 307/473; 307/455; 307/475; 307/557
[58] Field of Search ............... 307/443, 455, 456, 466, 307/467, 473, 475, 549, 557–558, 264

[56] References Cited

U.S. PATENT DOCUMENTS

| | | | |
|---|---|---|---|
| 4,382,197 | 5/1983 | Kiyozuka | 307/443 X |
| 4,410,816 | 10/1983 | Kanai | 307/443 X |
| 4,490,630 | 12/1984 | Freeman | 307/473 X |
| 4,596,940 | 6/1986 | Schuppan et al. | 307/443 |
| 4,636,990 | 1/1987 | Buscaglia et al. | 307/455 X |

*Primary Examiner*—Stanley D. Miller
*Assistant Examiner*—D. R. Hudspeth
*Attorney, Agent, or Firm*—Charles J. Fassbender; L. Joseph Marhoefer

[57] ABSTRACT

A three-state logic circuit comprising a logic gate on a semiconductor chip which includes first and second conductors, respective resistors connected to the conductors, terminals for receiving input signals, and transistors for generating complementary output signals on the first and second conductors by passing respective currents through the resistors as a logical function of the input signals with the output signals having high and low voltage levels $V_H$ and $V_L$; a control circuit on the chip having a first terminal connected to the first conductor, a second terminal connected to the second conductor, and a control terminal for receiving a control signal; a switching circuit within the control circuit which responds to the control signal by passing identical control currents through the respective resistors and into the first and second terminals to thereby lower the voltage levels on both the first and second conductors by at least $V_H-V_L$; and first and second driver transistors on the chip and respectively connected to the first and second conductors which drive complementary large and small currents off the chip in response to the voltage levels $V_H$ and $V_L$, and which drive no more than the small current off the chip in response to the lowered voltage levels.

6 Claims, 5 Drawing Figures

FIG.3.

$$eq\ 1 \sim I_4 = \frac{|V_T| - |V_H| - V_{BE}}{R_{12b}}$$

$$eq\ 2 \sim V_{10i} = I_4\ R_{10f}$$

$$eq\ 3 \sim |V_{11C}| = V_{10i} + V_{BE} \geq |V_L|$$

$$eq\ 4 \sim R_{12b} = R_{12e} \leq \frac{|V_T| - |V_H| - V_{BE}}{|V_L| - V_{BE}} \left[ R_{10f} \right]$$

THREE-STATE LOGIC CIRCUIT FOR WIRE-ORING TO A DATA BUS

BACKGROUND OF THE INVENTION

This invention relates to digital logic circuits; and more particularly, it relates to those logic circuits which are capable of being wire-ORed together on a bus.

Basically, any logic circuit receives multiple input signals which have high and low voltage levels that represent a "0" and a "1", and in response it generates output signals as a logical function of the input signals. These output signals also have a high and low voltage levels which represents a "0" and a "1".

Hundreds or even thousands of such circuits are typically integrated and interconnected on a single semiconductor chip. For example, commercially available ECL gate array chips contain over 2,000 logic circuits. These chips generally are soldered into printed circuit boards where they are interconnected via discrete or printed wires to form a digital system.

One type of chip interconnection which works with only certain types of logic circuits is called a wired-OR. With this connection, the output terminals from the logic circuits of several chips are interconnected via a single conductor to a terminating resistor. If the output signal from any one of the logic circuits is at a high voltage level, then the voltage on the terminating resistor is also high; whereas if the output signals from all the logic circuits are at a low voltage level, then the output voltage across the terminating resistor is also low.

This wired-OR type of connection is very useful as a date base. Each of the logic chips which is connected to the bus can send a signal over the bus so long as all of the other logic chips on the bus are generating a low voltage level. However, if some type of fault occurs in any one of the thousands of gates on a chip which causes that chip to erroneously generate a high voltage level on the bus, then the entire bus cannot operate.

Further, it is very difficult to determine which chip on a wire-ORed bus has a fault. For example, if 20 chips are connected to the bus, any one of those 20 chips could be erroneously generating the high voltage level. To determine which chip is faulty, the chips must be physically disconnected from the bus one at a time.

Accordingly, a primary object of the invention is to provide a logic circuit which has three output voltages (rather than just the usual two high and low voltages) to avoid the above described problem.

BRIEF SUMMARY OF THE INVENTION

In accordance with the invention, the above object and others are achieved by a three state logic circuit comprising:

a logic gate on a semiconductor chip which includes first and second conductors, respective resistors connected to the conductors, terminals for receiving input signals, and transistors for generating complementary output signals on the first and second conductors by passing respective currents through the resistors as a logical function of the input signals; the output signals having high and low voltage levels $V_H$ and $V_L$;

a control circuit on the chip having a first terminal connected to the first conductor, a second terminal connected to the second conductor, and a control terminal for receiving a control signal;

a switching circuit within the control circuit which responds to the control signal by passing identical control currents through the respective resistors and into the first and second terminals to thereby lower the voltage levels on both the first and second conductors by at least $V_H - V_L$; and first and second driver transistors on the chip and respectively connected to the first and second conductors which drive complementary large and small currents off the chip in response to the voltage levels $V_H$ and $V_L$, and which drive no more than the small current off the chip in response to the lowered voltage levels.

BRIEF DESCRIPTION OF THE DRAWINGS

Various features and advantages of the invention are described herein in conjunction with the accompanying drawings wherein:

FIG. 3 is a set of equations which define a constraint on a resistor in the FIG. 1 embodiment.

DETAILED DESCRIPTION OF THE INVENTION

Figure 1:
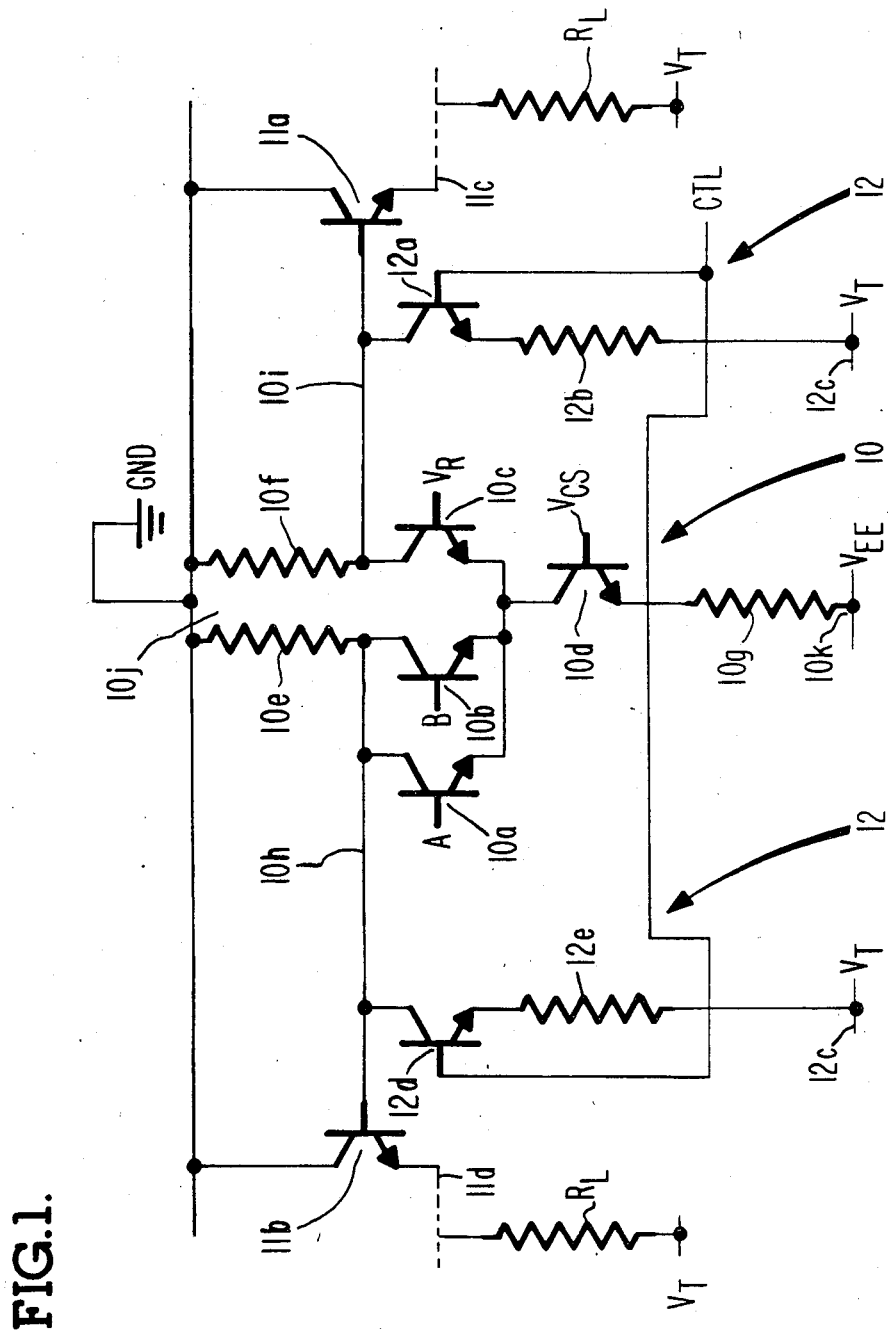
FIG. 1 is a detailed circuit diagram of one preferred embodiment of the invention.

Referring now to FIG. 1, a preferred embodiment of the invention will be described in detail. This embodiment includes a logic gate 10 whose components are indicated by reference numerals 10a thru 10k. Components 10a, 10b, 10c, and 10d are bipolar NPN transistors; components 10e, 10f, and 10g are resistors; components 10h and 10i are conductors on which complementary output logic signals of the gate are generated; and components 10j and 10k are voltage buses. All of these components are interconnected as illustrated and they are integrated on a semiconductor chip.

Transistors 10a and 10b respectively receive input logic signals A and B on their base; and transistor 10c receives a reference voltage $V_R$ on its base. If either logic signal A or B is higher than reference voltage $V_R$, then a current path is formed through resistor 10e, transistor 10a or 10b, transistor 10d, and resistor 10g. This generates a low voltage level on conductor 10h and a high voltage level on conductor 10i. Conversely, if both logic signals A and B are lower than reference voltage $V_R$, then a current path is formed through resistor 10f, transistor 10c, transistor 10d, and resistor 10g; and this generates a low voltage level on conductor 10i and a high voltage level on conductor 10h.

Also included in the FIG. 1 circuit are a pair of output driver transistors 11a and 11b. Transistor 11a has its base connected to conductor 10i and its collector connected to voltage bus 10j; and transistor 10b has its base connected to conductor 10h and its collector connected to voltage bus 10j. These transistors are integrated on the same chip as gate 10; and their emitters are respectively connected to output terminals 11c and 11d of the chip.

In a system of several chips, the terminals 11c can be wire-ORed via an external conductor which interconnects those terminals to a load resistors $R_L$. If transistor 11a on any one of the chips receives a high voltage level on its base, then it drives a large current off of the chip to its external load resistor; whereas if it receives a low voltage level on its base then it drives a small current off of the chip to its load resistor. Terminals 11d of several chips can also be wire-ORed in the same fashion.

Further included in the FIG. 1 circuit is a control circuit 12 which includes components 12a thru 12e. Components 12a and 12d are bipolar NPN transistors; components 12d and 12e are resistors; and component 12c is a voltage bus. These components are interconnected as illustrated in FIG. 1, and they are integrated on the same chip as gate 10.

In operation, transistor 12a and 12d receive a logic control signal CTL on their base. When signal CTL is low, transistors 12a and 12d turn off and so the voltage levels which gate 10 generates on conductors 10h and 10i are unaffected. Conversely, when signal CTL is high, then transistors 12a and 12d turn on, and this lowers the voltage levels which gate 10 generates on conductors 10i and 10h.

More specifically, when transistor 12a turns on, a low resistance path is formed between conductor 10i and voltage bus 12c. This causes a current to flow through resistor 10f, conductor 10i, transistor 12a, and resistor 12b; and this current produces a voltage drop across resistor 10f which is superimposed upon the voltage drop that is caused by the current which flows through gate 10.

Similarly, when transistor 12d turns on, a low resistance path is formed between conductor 10h and voltage bus 12c. This causes a current to flow through resistor 10e, conductor 10h, transistor 12d, and resistor 12e; and that current produces a voltage drop across resistor 10e which is superimposed upon the voltage drop that is caused by the current which flows through gate 10.

One example of the actual current, voltage, and resistance values which may occur in the FIG. 1 circuit is as follows: Resistors 10e and 10f are 260 ohms; resistors 12b and 12e are 144 ohms; each load resistor $R_L$ is 50 ohms; voltage $V_{EE}$ is −4.5 volts; voltage $V_R$ is −1.3 volts; voltage $V_T$ is −2 volts; voltage $V_{CS}$ is −3.25; and signals A, B, and CTL have a low level of −1.6 volts and a high level of −0.8 volts. When these values are employed, the operation of the FIG. 1 circuit is illustrated in FIGS. 2A and 2B.

Figure 2A:
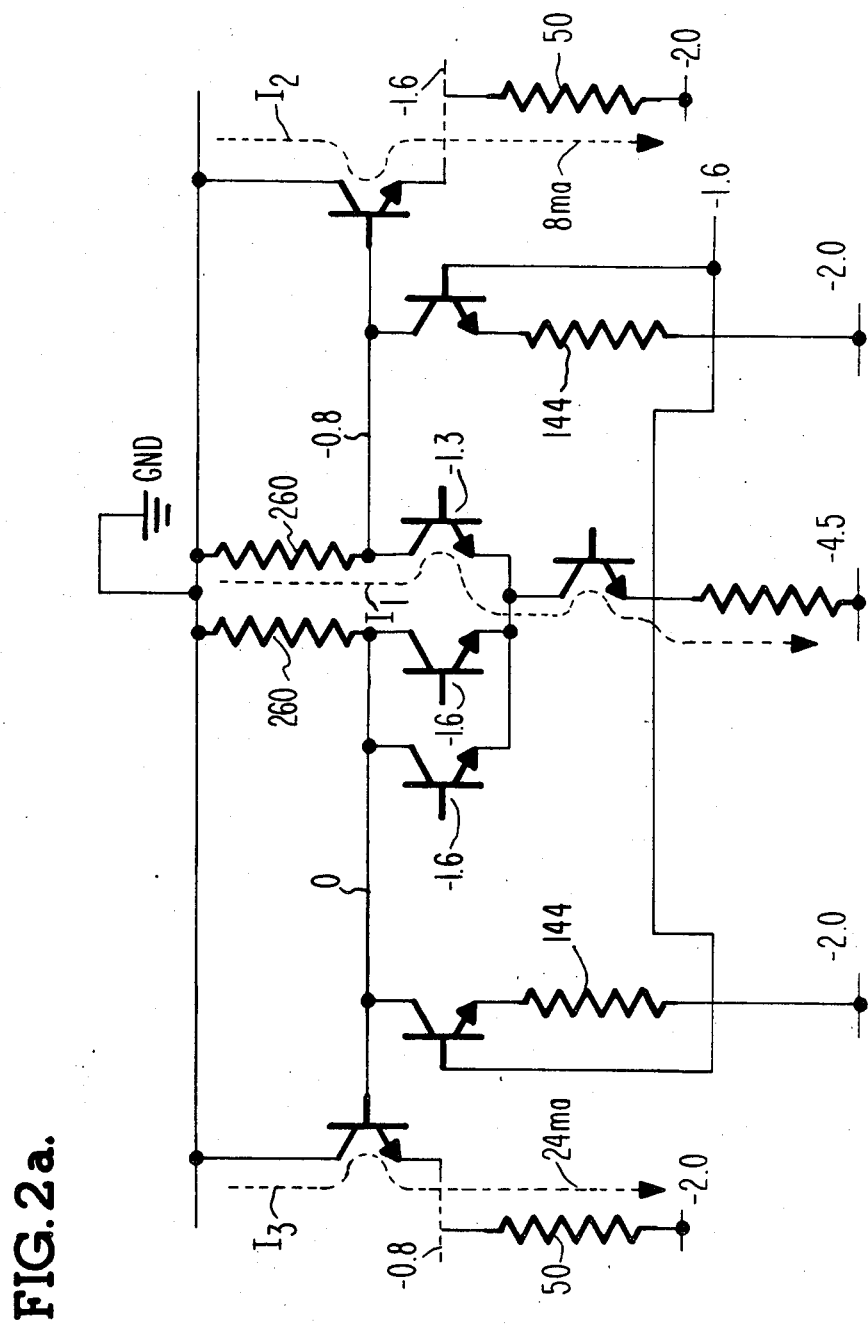
FIGS. 2A and 2B are circuit diagrams which illustrate the operation of the FIG. 1 embodiment.
Figure 2B:
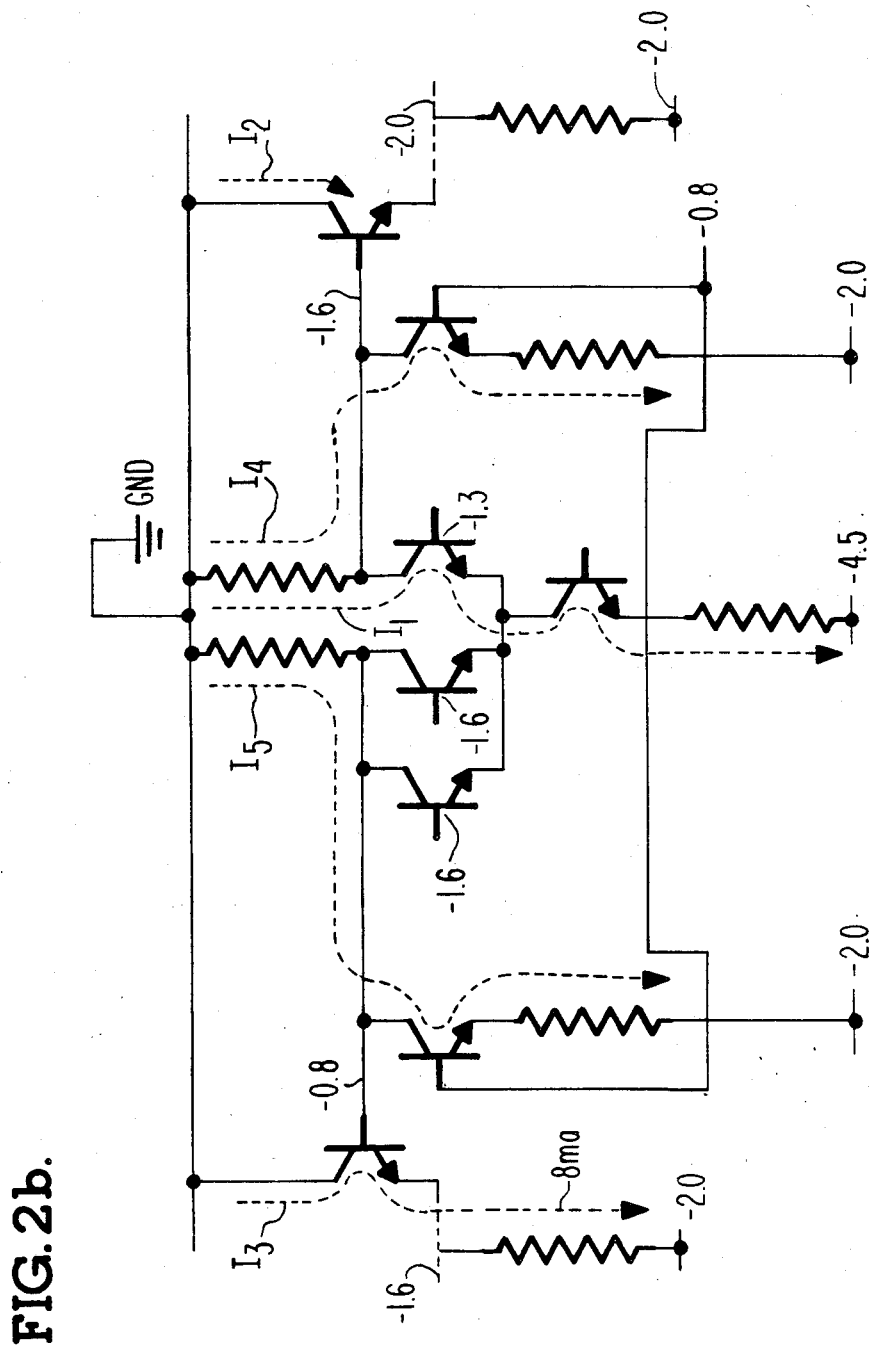

Consider first FIG. 2A. There, the control signal CTL is at a low level or −1.6 volts. Consequently, the transistors 12a and 12d are turned off, and so the voltage levels on the conductors 10h and 10i are determined solely by the operation of logic gate 10.

In FIG. 2A, logic signals A and B are both low so transistors 10a and 10b turn off and transistor 10c turns on. Thus a current $I_1$ flows through resistor 10f but no current flows through resistor 10e. Current $I_1$ generates a voltage of −0.8 volts on conductor 10i which causes a current of 8 milliamps to flow through transistor 11a. The absence of current through resistor 10e causes ground or zero volts to be generated on conductor 10h; and that in turn causes a current of 24 milliamps to flow through transistor 11b.

Note that if either or both of the logic signals A and B were at their high level of −0.8 volts, then current $I_1$ would flow through resistor 10e and no current would flow through resistor 10f. Thus −0.8 volts would be generated on conductor 10h and 8 milliamps would flow through transistor 11b; while 0 volts would be generated on conductor 10i and 24 milliamps would flow through transistor 11a.

Turning now to FIG. 2B, it illustrates the case where signal CTL is at a high logic level of −0.8 volts. As a result, transistors 12a and 12d both turn on. Thus a current $I_4$ flows through resistor 10e, transistor 12d, and resistor 12e; and a current $I_5$ of the same magnitude flows through resistor 10f, transistor 12a, and resistor 12b. These currents $I_4$ and $I_5$ lower the respective voltages which gate 10 generates on conductors 10h and 10i by −0.8 volts.

Consequently, in the case illustrated in FIG. 2B where signals A and B are both low, the 0 volts which gate 10 generates on conductor 10h is lowered to −0.8 volts, and the −0.8 volts which gate 10 generates on conductor 10i is lowered to −1.6 volts. Thus current $I_3$ through transistor 11b is reduced from 24 milliamps to 8 milliamps, and current $I_2$ through transistor 11a is reduced from 8 milliamps to 0.

From the above description it can be seen that the FIG. 1 circuit will operate properly so long as the currents $I_4$ and $I_5$ are large enough to shift a high voltage level on the conductors 10i and 10h to or below a low voltage level. This in turn will assure that the output voltage across both of the load resistors will be at or below their low voltage level. Currents $I_4$ and $I_5$ are increased by decreasing the resistors 12b and 12e; and the upper limit for those resistors is derived by a set of equations in FIG. 3.

Equation 1 states that the current $I_4$ is equal to the magnitude of the reference voltage $V_T$ minus the magnitude of the high level $V_H$ of control signal CTL minus the base emitter drop across transistor 12a divided by the value of resistor 12b. Next, equation 2 states that the voltage on conductor 10i is equal to the current $I_4$ times the value of resistor 10f. Equation 3 then states that the magnitude of the output voltage on terminal 11c is equal to the voltage on conductor 10i plus the base emitter voltage drop on transistor 11a, and that voltage magnitude on terminal 11c must be greater than or equal to the magnitude of a low logic level. Substituting equations 1 and 2 into equation 3 and algebraically solving for resistor 12b yields equation 4. This equation sets a constraint for resistors 12b and 12e.

One feature of the above described logic circuit is that the control circuit 12 does not add any delay to the normal transmission of signals through the logic gate 10. This is because the control circuit 12 is connected to the conductors 10i and 10h in parallel with (as opposed to in series with) the transistors 10a thru 10f of logic gate 10.

Another feature of the above logic circuit is that control circuit 12 does not dissipate any power when logic gate 10 is operating. This is because the currents $I_4$ and $I_5$ are zero when the control signal CTL is low.

Figure 4:
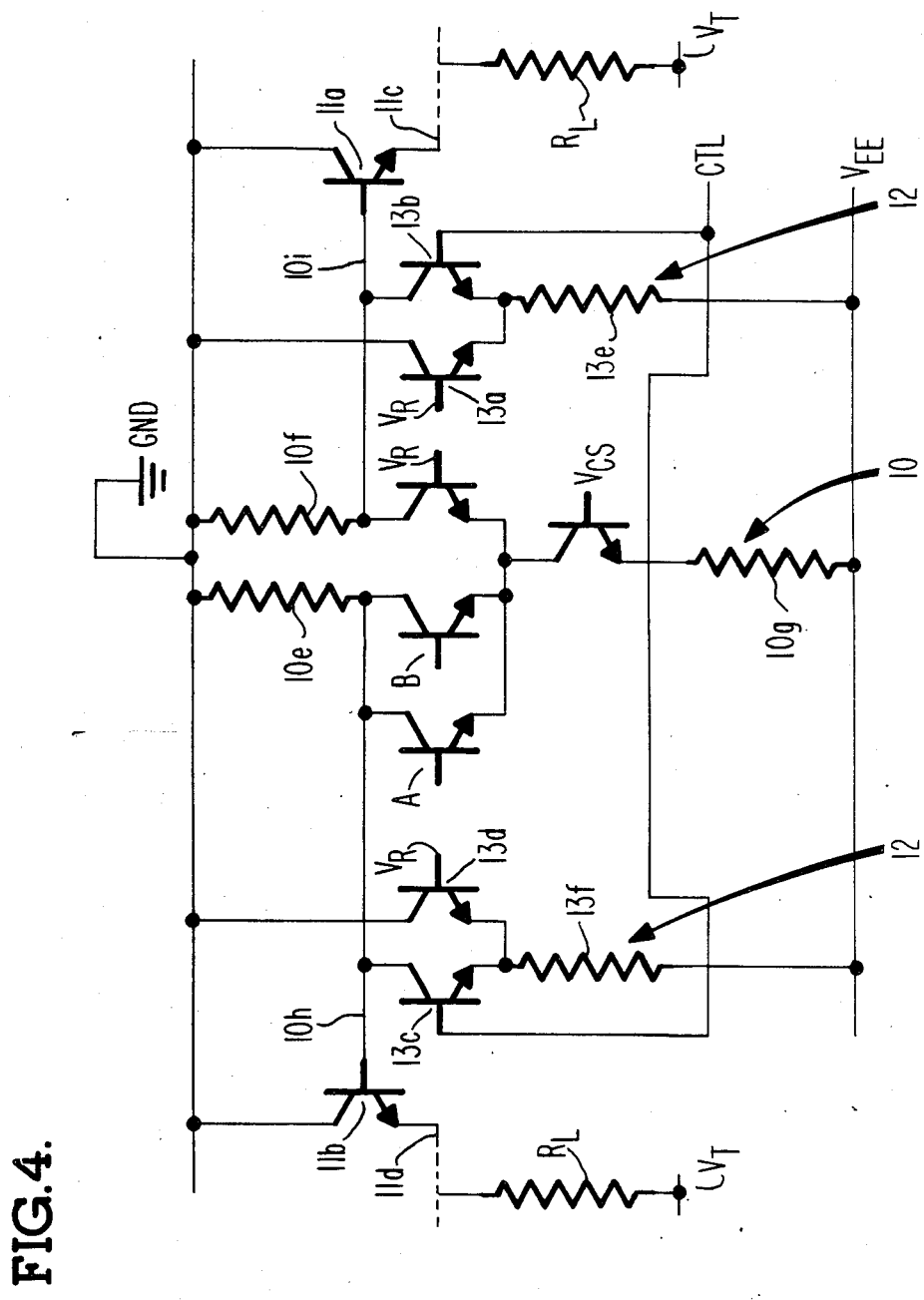
FIG. 4 is a second embodiment of the invention.

A preferred embodiment of the invention has now been described in detail. In addition, however, many changes and modifications can be made to this embodiment without departing from the nature and the spirit of the invention. For example, FIG. 4 shows a modification of the FIG. 1 embodiment in which the control circuit is changed as indicated by reference numeral 13, but the logic gate 10 and output driver transistors 11a and 11b remain the same.

This modified control circuit 13 includes four bipolar NPN transistors 13a, 13b, 13c and 13d, and two resistors 13e and 13f. All these components are interconnected as illustrated in FIG. 4, and they are integrated on the same chip as gate 10.

Control signal CTL is received by the base of transistors 13b and 13c, and reference voltage $V_R$ (which lies midway between the high and low voltage levels of signals CTL, A, and B) is received by the base of transistors 13a and 13d. Reference voltage V<sub>EE</sub> (which is the same reference voltage that is applied to resistor 10g) is also applied to resistors 13e and 13f.

In operation, transistors 13a and 13b act as a differential pair in which current flows through transistor 13a when signal CTL is low, and current flows through transistor 13b when signal CTL is high. Similarly, transistors 13c and 13d act as a differential pair in which current flows through transistor 13d when signal CTL is low and current flows through transistor 13c when signal CTL is high.

Those currents which flow through transistors 13b and 13c produce a voltage drop across resistors 10f and 10e which shifts the high voltage levels on the conductors 10h and 10i to or below a low voltage level. Thus the currents through transistors 13b and 13c function just like the previously described currents I<sub>4</sub> and I<sub>5</sub> of FIG. 2B. Their magnitudes are increased by decreasing the magnitudes of resistors 13e and 13f, and the upper limit for those resistors is also given by the previously derived equation 4.

Various other modifications may also be made to the embodiments of FIGS. 1 and 4 without departing from the scope of the invention. Accordingly, it is to be understood that the invention is not limited to the details of those embodiments but is defined by the appended claims.

What is claimed is:

1. A three-state logic circuit comprising:

a logic gate on a semiconductor chip which includes first and second conductors, respective resistors connected to said conductors, a means for receiving input signals, and a means for generating complementary output signals on said first and second conductors by passing respective currents through said resistors as a logical function of said input signals; said output signals having high and low voltage levels $V_H$ and $V_L$;

a control means on said chip for lowering said voltage levels on both said first and second conductors by at least $V_H - V_L$; said control means including a pair of transistors that respectively receive a reference voltage and a control signal on their base, having collectors that respectively connect to said first conductor and to a ground bus, and having emitters that are coupled together through a resistive means to a voltage bus, said control means further including another pair of transistors and another resistive means which are connected in the same fashion to said second conductor; and first and second driver means on said chip and respectively connected to said first and second conductors which drive complementary large and small currents off said chip in response to said voltage levels $V_H$ and $V_L$, and which drive no more than said small current off said chip in response to said lowered voltage levels.

2. A three-state logic circuit comprising:

a logic gate on a semiconductor chip which includes a conductor, a resistor connected to said conductor, a means for receiving input signals and a means for generating high and low voltage levels $V_H$ and $V_L$ on said conductor by passing respective currents through said resistor;

a control means on said chip for receiving a control signal, and in response thereto, generating another voltage level on said conductor whic is at least as low as level $V_L$; said control means including a pair of transistors that respectively receive a reference voltage and a control signal on their base, having collectors that respectively connect to said conductor and to a ground bus, and having emitters that are coupled together through a resistive means to a voltage bus.

3. A three-state logic circuit according to claim 2 and further including a drive means on said chip which receives said voltage levels on said conductor and drives a large current off said chip in response to said voltage $V_H$, drives a small circuit off said chip in response to said voltage $V_L$, and drives no more than said small current off said chip in response to either of said lowered voltage levels.

4. A three-state logic circuit according to claim 3 wherein said drive means is a transistor having a base connected to said output conductor, a collector connected to a ground bus, and an open emitter which drives an output terminal of said chip.

5. A three-state logic circuit comprising:

a conductor for carrying output signals of said circuit;

a logic gate having input terminals for receiving input logic signals and having a means for generating high and low output voltages $V_H$ and $V_L$ on said conductor as a logical function of said input logic signals; and a control circuit, connected to said conductor in parallel with said logic gate, which responds to a control signal by lowering said voltages $V_H$ and $V_L$ on said conductor by an increment which is at least as large as $V_H - V_L$; said control circuit including a pair of transistors that respectively receive a reference voltage and a control signal on their base, having collectors that respectively connect to said conductor and to a ground bus, and having emitters that are coupled together through a resistive means to a voltage bus.

6. A three-state logic circuit according to claim 5 and further including a drive means on said chip which receives said voltage levels on said conductor and drives a large current off said chip in response to said voltage $V_H$, drives a small current off said chip in response to said voltage $V_L$, and drives no more than said small current off said chip in response to either of said lowered voltage levels.

* * * * *